United States Patent
Ouchi et al.

(10) Patent No.: US 6,538,209 B1
(45) Date of Patent: Mar. 25, 2003

(54) SUBSTRATE FOR MOUNTING SEMICONDUCTOR ELEMENT HAVING CIRCUIT PATTERNS, AND AN INSULATING LAYER MADE OF PHOTOSENSITIVE AND THERMALLY-MELTING TYPE ADHESIVE RESIN

(75) Inventors: Kazuo Ouchi, Osaka (JP); Kazunori Mune, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/397,111

(22) Filed: Sep. 16, 1999

(30) Foreign Application Priority Data

Sep. 17, 1998 (JP) .............................. 10-263712

(51) Int. Cl.⁷ .................................. H05K 1/03
(52) U.S. Cl. ..................... 174/256; 174/255; 174/262; 361/792
(58) Field of Search ................. 174/255, 260, 174/266, 258, 259; 361/760, 767, 783, 792, 795

(56) References Cited

U.S. PATENT DOCUMENTS

| | | | | |
|---|---|---|---|---|
| 4,521,262 A | * | 6/1985 | Pellegrino ................... | 156/150 |
| 4,528,064 A | * | 7/1985 | Oshawa et al. .............. | 156/630 |
| 4,859,571 A | * | 8/1989 | Cohen et al. ................ | 430/272 |
| 4,993,148 A | * | 2/1991 | Adachi et al. ............... | 174/252 |
| 5,006,673 A | * | 4/1991 | Freyman et al. ............. | 174/255 |
| 5,081,562 A | * | 1/1992 | Adachi et al. ............... | 174/255 |
| 5,455,393 A | * | 10/1995 | Oshima et al. .............. | 174/250 |
| 5,736,780 A | * | 4/1998 | Murayama ................... | 257/673 |
| 5,737,191 A | * | 4/1998 | Horiuchi et al. ............. | 361/764 |
| 5,798,563 A | * | 8/1998 | Feilchenfeld et al. ........ | 174/255 |
| 5,886,877 A | * | 3/1999 | Shingai et al. .............. | 361/768 |
| 5,892,288 A | * | 4/1999 | Muraki et al. ............... | 257/778 |
| 6,281,448 B1 | * | 8/2001 | Tsukamoto .................. | 174/260 |

* cited by examiner

Primary Examiner—Albert W. Paladini
Assistant Examiner—José H. Alcala
(74) Attorney, Agent, or Firm—Sughrue Mion, PLLC

(57) ABSTRACT

Circuit patterns are formed on the one surface of an insulating substrate, and an insulating layer is formed to cover the circuit patterns. The insulating layer is made of a photosensitive and thermally-melting type adhesive resin. In the insulating layer, through-holes are made by exposure/development processing to form conductive paths for contacts and contact portions. On the other surface of the insulating substrate, a conductive layer is formed and openings each passing through the conductive layer and insulating substrate are formed. Thus, a mounting substrate can be obtained which has a structure in which first circuit patterns each is exposed in each of the openings. A chip is mounted on the mounting substrate thus formed and heated. The insulating layer serves as an adhesive to seal the active face of the chip.

10 Claims, 5 Drawing Sheets

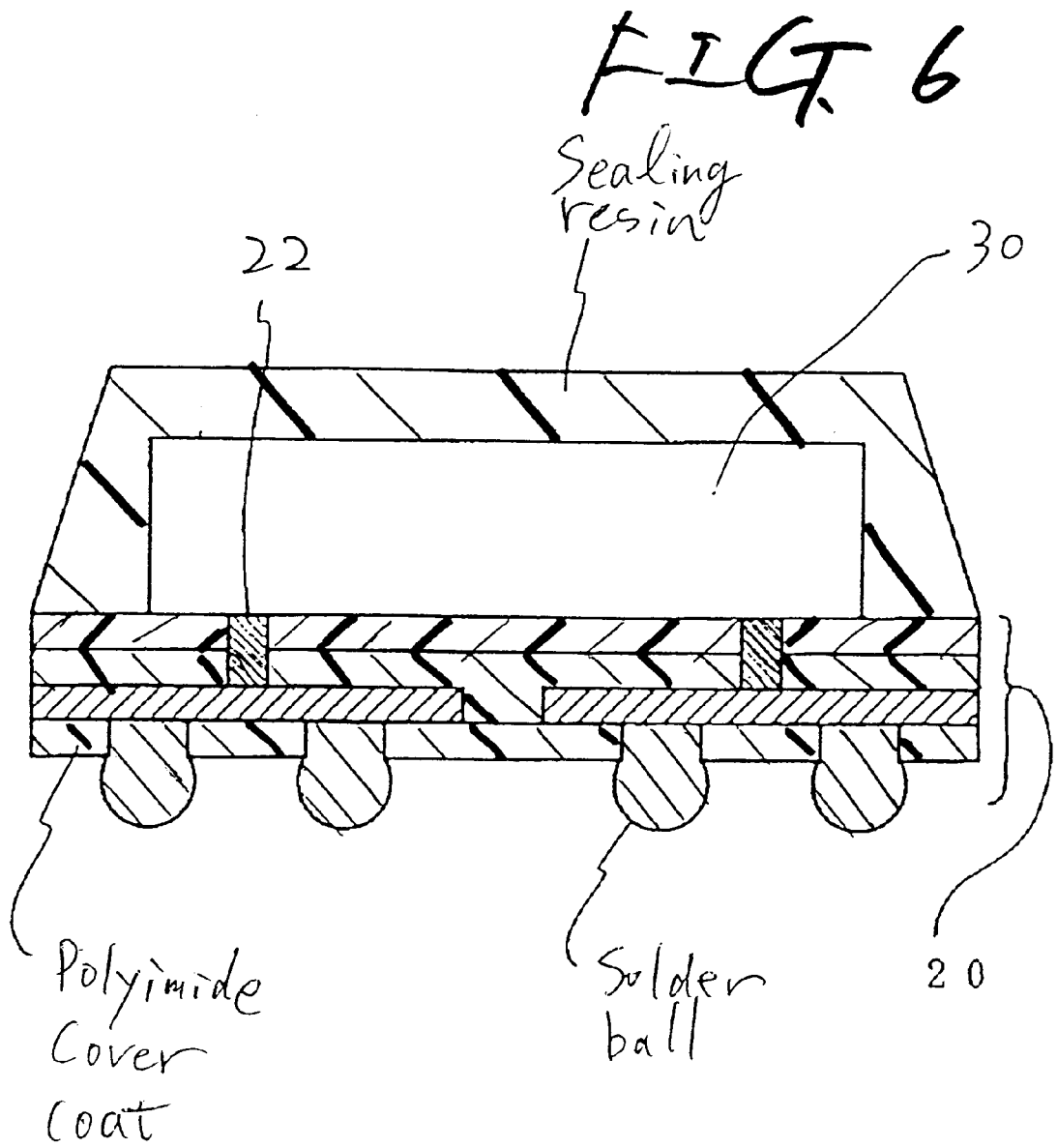

SUBSTRATE FOR MOUNTING SEMICONDUCTOR ELEMENT HAVING CIRCUIT PATTERNS, AND AN INSULATING LAYER MADE OF PHOTOSENSITIVE AND THERMALLY-MELTING TYPE ADHESIVE RESIN

BACKGROUND OF THE INVENTION

1. Field of the Invention

The present invention belongs to a technical field of a circuit board, film carrier, etc. for mounting a semiconductor device.

The present application is based on Japanese Patent Application No. Hei. 10-263712, which is incorporated herein by reference.

2. Description of the Related Art

Various types of circuit boards have been proposed each for mounting a bare chip (which is obtained by individually cutting out a collection of a large number of integrated circuits repeated formed on a wafer) of the integrated circuit.

FIG. 4 shows an example thereof in which a bare chip 30 is mounted on a circuit board 20 and resin-sealed. In this example, a plastic substrate (polyimide substrate) 21 is used in place of a lead frame. The plastic substrate 21 is connected to an electrode pad used on an active face of the bare chip 30 (upper face of the bare chip in the drawing) through a gold wire 50 by wire bonding.

However, the circuit board as shown in FIG. 4 suffers from basic problems (contact between the wires and upper limit of a wire loop) of wire bonding due to high density wiring of electrode pads or arrangement of an area pad on the bare chip. In order to connect the wire to the active face of the bare chip, the deactive face (lower face in the drawing) is secured to the substrate. Therefore, the heat of the device cannot be effectively diffused from the non-active face. In addition, an increase in the wiring length in the wire bonding limits a transmission characteristic of a high speed signal. Further, as seen from FIG. 4, an adhesive layer 40 for fixing the bare chip 30 to the circuit board 20 must be prepared separately.

FIG. 5 shows another example of a circuit board for mounting the bare chip in which a bare chip 30 is mounted on a circuit board 20 and resin-sealed like FIG. 4. The example shown in FIG. 5, in which the circuit board 20 is connected to the bare chip 30 through a beam lead, also suffers from the problem of high density and area pad arrangement. In addition, an adhesive buffer material (elastomer) 41 must be separately prepared between the circuit board 20 and the bare chip 30.

In order to solve the above problems, a circuit board as shown in FIG. 6 has been proposed in e.g. Japanese Patent 202506 "WIRING BOARD AND ITS MANUFACTURING METHOD", Japanese Unexamined Patent Publications Nos. Hei. 2-229445, 2-229442, 3-046262 and 3-062533. As seen from FIG. 6, the circuit board 20 for mounting an element or device is provided with bump contacts 22. The bump contacts 22 are directly connected to the electrode pads formed on the active face of the bare chip 30 to solve the above problem of high density and area pad arrangement. Further, the mounting face of the substrate is given adhesive property so that the adhesive layer and buffer agent must be prepared separately.

In the circuit board as shown in FIG. 6, it is recommended to use an excimer laser for hole processing for a conductive path for forming a bump or hole processing on the back face of the circuit board. However, the excimer laser requires complicate management, takes high running cost and cannot realize mass-production.

SUMMARY OF THE INVENTION

An object of the present invention is to solve the above problem to provide a substrate for mounting a semiconductor element having a structure which can be manufactured at low cost and high mass-productivity, and its manufacturing method and use.

(A) The substrate for mounting a semiconductor device is characterized by comprising: an insulating substrate; a first circuit pattern formed on the first main surface of said insulating substrate; an insulating layer covering the circuit pattern, the insulating layer being made of a photosensitive and thermally-melting type adhesive resin; a contact formed on the surface of the insulating layer, the contact being connected to the circuit pattern by a first conductive path passing through the insulating layer; a conductive layer formed on the second main surface of the insulating substrate opposite to the first main surface; and the conductive layer and the insulating substrate having a through-hole into which the circuit pattern is exposed.

(B) The semiconductor device according to the present invention is one in which a semiconductor element is mounted on the mounting substrate according to the present invention is characterized in that the contact of the substrate is connected to an electrode pad of the semiconductor device, and the insulting layer is bonded onto a surface of the semiconductor element on the side of the electrode pad by heating.

(C) The method of manufacturing a substrate for mounting a semiconductor element is characterized by comprising the steps:

(a) preparing a member of an insulating substrate on the first main surface of which the first circuit pattern is formed and on the second main surface of which a conductive layer is formed having an opening into which the insulating substrate is exposed at a position corresponding to the first circuit pattern;

(b) forming an insulating layer covering the circuit pattern formed in the step of (a) using an insulating material of a photosensitive and thermally-melting type adhesive resin;

(c) forming a through-hole in the insulating layer formed in step (b) through exposure/development processing, thereby exposing the first circuit pattern into the through-hole;

(d) filling the through-hole with conductor formed in step (c), thereby forming a first conductive path passing through the insulating layer to provide a contact on the surface of the insulating layer; and (e) removing the insulating substrate exposed into the opening of the conductive layer using the conductive layer in step (a) as a mask so that the opening is passed through the conductive layer and the insulating substrate and the first circuit pattern is exposed into the opening.

Hereinafter, the substrate for mounting a semiconductor element is also referred to "mounting substrate".

By using, as a material of the insulating layer on which a semiconductor element is mounted, an insulating material which is a photosensitive and thermally-melting type adhesive resin, only the presence of this insulating layer simultaneously satisfies the following two points:

(1) In order to form a conductive path for a contact point on the insulating layer, hole processing can be performed through exposure/development using photosensitivity. This permits the excimer laser to be omitted.

(2) In mounting of the semiconductor device, the surface of the insulating layer is bonded to the active face of the element. This removes necessity of preparing an adhesive layer between the element and the mounting substrate.

Features and advantages of the invention will be evident from the following detailed description of the preferred embodiments described in conjunction with the attached drawings.

BRIEF DESCRIPTION OF THE DRAWINGS

FIG. 6 is a sectional view showing another example of a conventional semiconductor device.

DETAILED DESCRIPTION OF THE PREFERRED EMBODIMENTS

An explanation will be given a method of manufacturing a mounting substrate according to the present invention, and also the structure of the mounting substrate.

FIGS. 1A to 1E are views showing the state of the mounting state in each of the steps in a manufacturing method according to the present invention. The order of the steps illustrated in FIG. 1 is exemplary for convenience of explanation. The method of manufacturing the mounting substrate according to the present invention, as described as the manufacturing method in item (C), comprises the processing steps of (a)–(e). These steps themselves will be explained in order as well as the processing, material and structure in each step.

Figure 1A:
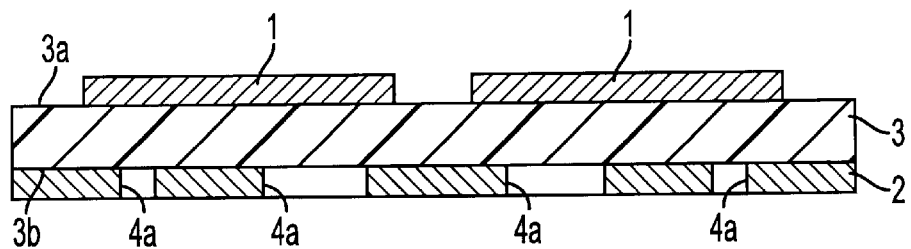
FIGS. 1A to 1E are views showing the state of a mounting substrate in each of the steps of the manufacturing method according to the present invention.

FIG. 1A shows the state in step (a). Circuit patterns 1 are formed on the one surface 3a of an insulating substrate 3 while a conductive layer having openings 4a is formed on the other surface, thus preparing a substrate member. The openings 4a are formed at the positions of the back surface (surface 3b) corresponding to the circuit patterns 1 (i.e. positions overlapping the circuit patterns when the openings 4a are projected on the one surface 3a of the insulating substrate). It should be noted that the insulating substrate is exposed in each of the openings.

The above step (a) is not limited in its processing manner as long as the substrate member can be obtained eventually. For example, the following processing techniques can be adopted.

(1) Three layers, i.e. a conductive layer for forming the circuit patterns 1 (hereinafter referred to as "first conductive layer"), an insulating substrate 3 and a conductive layer with no opening for forming the conductive layer 2 (hereinafter referred to as "second conductive layer), are bonded to produce a three-layer structure. By the subtractive technique, the first layer is formed into the circuit patterns 1 and the second layer is processed to provide the conductive layer 2 having the openings 4a (hereinafter "conductive layer" refers to the conductive layer 2).

(2) A precursor for the material of the insulating substrate is applied onto the first conductive layer and dried to provide a two-layer structure. After the second layer is deposited, the circuit patterns and openings are formed by the subtractive technique.

(3) By the semi-additive technique or additive technique, both the circuit patterns and conductive layer are directly formed on both surfaces of the insulating substrate. The semi-additive technique is a technique in which the first and second conductive layers are formed on the insulating substrate by vapor deposition or sputtering, resist for plating is applied to the surfaces thereof, necessary electric plating is made, and the resist is removed to remove the conductive layers at unnecessary portions.

In addition to the processing techniques described above, in order to form the circuit patterns and openings, the "subtractive technique", "semi-additive technique" and "additive technique" may be combined optionally for processing. The order or priority of the processing may be also optionally determined.

In the conventional method of manufacturing a mounting substrate, the subtractive technique is recommended as a technique for manufacturing the circuit pattern. However, it has been found that the subtractive technique cannot deal with the high-density wiring expected in the near future. In order to overcome such disadvantages, in accordance with the present invention, the semi-additive technique or additive technique is recommended to form the circuit patterns.

In FIG. 1A, the substrate member is illustrated as a structure having only three layers. However, an adhesive layer may be located as an inter-layer according to the processing technique. Further, the circuit patterns, conductive layer and insulating substrate may be formed as not a single layer but a multi-layer.

The material of the insulating substrate may be heat-resistant plastic such as polyimide, polyether imide, polyether sulfone (PES), polyether ether ketone (PEEK); polyethyleneterephthalate (PET), aramide resin used as a flexible printed circuit; or a material having photosensitivity based on these materials.

The thickness of the insulating substrate may be 5 $\mu$m–200 $\mu$m, preferably 10 $\mu$m–50 $\mu$m.

The circuit patterns and conductive layer may be preferably a highly-conductive material such as copper, nickel, gold or solder and the alloy of these metals, which are commonly used to form the circuit pattern. In order to improve the contactness of the insulating substrate, an underlying metal such as chromium or nickel may be formed.

The circuit patterns are provided as patterns which can be connected to contact points 7 (e.g. pattern passing through the contact point in a vertical direction).

Figure 1B:
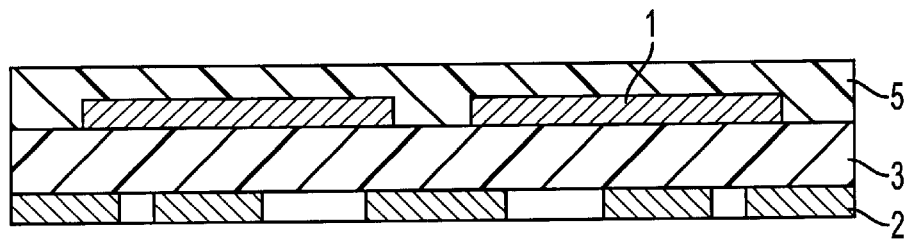
Figure 1C:
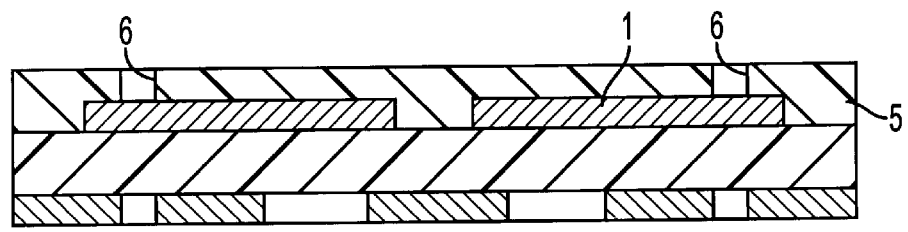
Figure 1D:
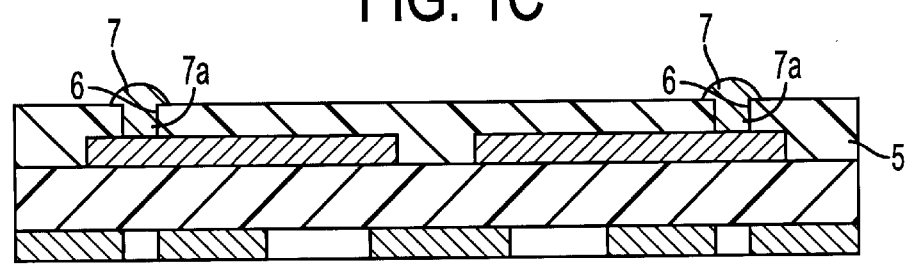
Figure 1E:
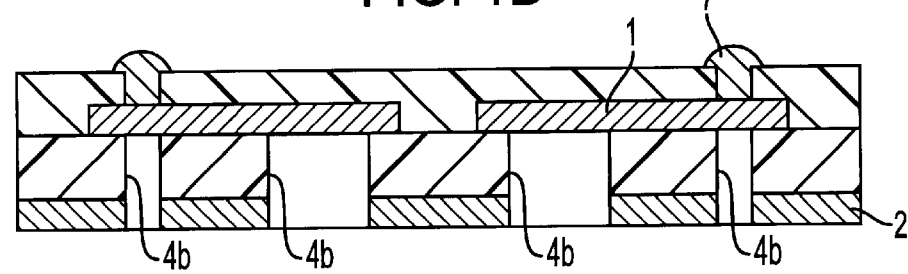

The openings are formed in the conductive layer at the positions where the circuit pattern is exposed in each of the openings 4b as shown in FIG. 1E. Inversely, taking this into consideration, the circuit patterns are designed.

FIG. 1B shows the state of step (b) in which the circuit patterns 1 are covered with an insulating material of photosensitive and thermally-melting type adhesive resin to form an insulating layer.

The insulating material of photosensitive and thermally-melting type adhesive resin must have all the following properties.

(1) It is an insulating material which can be formed as an insulating layer.

ylene glycol and trimellitic acid anhydride) expressed by formula (2); and 4, 4'-oxydiphthallic acid dianhydride, 3,3', 4,4'-benzophenone tetracarboxylic acid dianhydride expressed by formula (3).

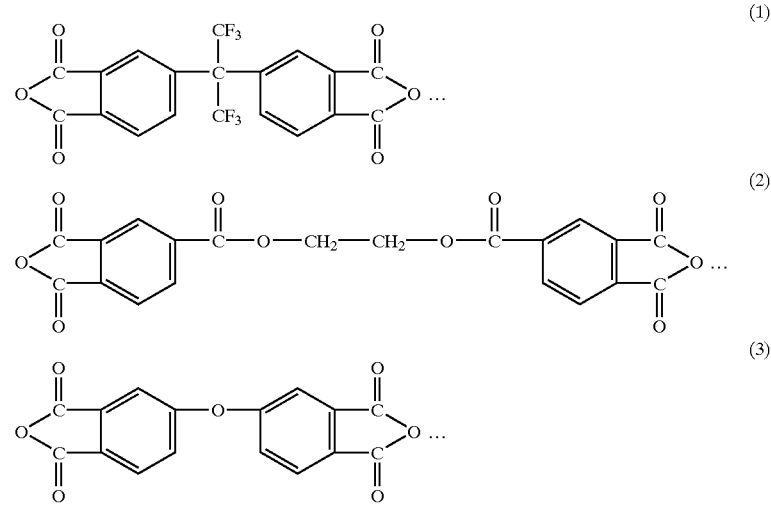

(2) It can be dealt with as photosensitive resin when the insulating layer is subjected to the hole-processing so that the hole-processing by the exposure/development can be performed for the photosensitive resin. The photosensitive resin may have a property of a negative type and a positive type.

(3) When and after the element is mounted, the material at issue can be dealt with as a thermal-melting type adhesive. Namely, the material is a kind of hot-melt material which serves as an adhesive by heating.

Hereinafter, the "insulating material of photosensitive and thermally-melting type adhesive resin" refers to "insulating layer material".

The specific insulating material may be e.g. photosensitive polyimide, photosensitive polyether sulfone, preferably, the photosensitive polyimide.

The photosensitive polyimide can be obtained as a polyimide precursor which can provide photosensitivity by combining polyamic acid (polyamide acid) with a photosensitive agent. In this case, the material constituting the insulating layer is a photosensitive polyimide precursor at the stage before exposure for hole processing. It is partially "imided" after the exposure/development (hole processing). Further, it is polyimide resin at the stage when curing for making polyimide has been carried out by heating (state of the insulating layer in a completed product on which the element can be mounted).

The photosensitive polyimide precursor can be manufactured by reacting an acid dianhydride component and diamine component at substantially the equal mol ratio in a suitable solvent (e.g. N,N-dimethyl acetamide or N-methyl-2-pyrrolidone) to create polyamic acid and combining it with photosensitive agent. Epoxy resin, bisallylnadic imide or male-imide may be added as required.

The above acid dianhydride component may be 2,2-bis (3, 4-dicarboxyphenyl)hexafluoropropane dianhydride (6FDA) expressed by formula (1); TMEG (ester compound of eth- The diamine component may be e.g. 4,4'-diaminodiphenylether, 1,3-bis (4-aminophenoxy) benzene, or bisaminopropyltetramethyldisiloxane expressed by formula (4).

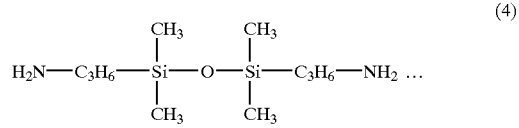

The photosensitive agent may be preferably 1,4-dihydropiridine derivative expressed by formula (5), particularly preferably 1-ethyl-3,5-dimethyl carbonyl-4-(2-nitrophenyl)-1,4-dihydropiridine, or 1,2,6-trimethyl-3,5-dicarbonyl-4(2-nitrophenyl)-1,4-dihydropiridine.

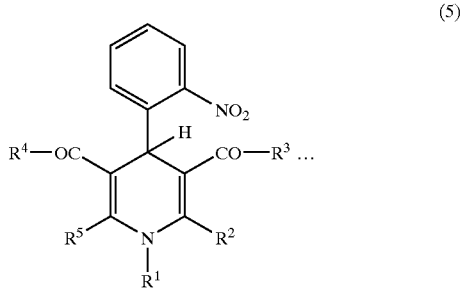

(where $R^1$–$R^5$ is an organic radix of number of 1–4 of oxygen or carbon)

The above photosensitive agent is used at a ratio of 0.1–1.0 mol to a total amount of 1 mol of the acid dianhydride component and diamine component. With the photosensitive agent used at the ratio higher than 1 mol, when the semiconductor element is bonded to the substrate by thermal crimping, the remaining excessive component of the photosensitive agent is decomposed to evaporate, thus reducing the adhesive force. With the photosensitive agent used at the ratio lower than 0.1 mol, precision of making a hole pattern is lowered.

The melting viscosity of the insulating layer material at 250° C. is preferably 1,000–1,000,000 PaS, particularly preferably 5000–500,000 PaS.

The glass transition temperature (Tg) of the insulating layer material is preferably 50–250° C., particularly 100–200° C.

The insulating layer can be formed by a technique (1) in which a solution of an insulating layer material solved in an organic solvent is applied to cover a circuit wiring pattern and dried to provide the insulating layer, and a technique (2) in which the insulating layer-material is prepared as a dry film in a separate step and the dry film is caused to cover a circuit wiring pattern on a substrate member as the insulating layer. The organic solvent in the technique (1) may be e.g. N-methyl-2-pyrrolidone, N,N-dimetylacetamide, N,N-dimetylform amide, etc.

FIG. 1C shows the state of step (c). As described above, using the property of the insulating layer material as photosensitive resin, this step is to perform hole-making through exposure/development. In FIG. 1C, through-holes 6 are formed in the insulating layer 5 formed at step (b) through the exposure/development so that the circuit pattern 1 is exposed in each through-hole 6.

The hole-making processing by the exposure/development is to make the portion exposed using a photomask insoluble ("negative type") or soluble ("positive type") so that the material in the hole is removed. Thus, the hole-making processing can be performed at a higher speed and lower cost than the conventional excimer laser processing.

The radiation for light-exposure may be radiation for activation according to the photosensitivity of the material such as ultra-violet rays, electron beams, microwave, etc. which are previously known radiations used in the exposure/development for photosensitive resin.

The removal agent for development may any agent as long as it can remove the material of the portion which is soluble after the exposure. Namely, it may be a previously known developing agent used for exposure/development for the photosensitive resin, such as an alkaline water solution.

FIG. 1D shows the state of step (d). This step is to fill each through-hole 6 (FIG. 1C) formed in the insulating layer 5 with conductor to provide a conductive path 7a and locate a contact portion 7 at the upper end (on the surface side of the insulating layer 5). In the example as shown in FIG. 1D, the contact portion is a bump contact which protrudes from the surface of the insulating layer 5. However, it may be the exposed surface of the conductive path in which the through-hole 6 is only filled with conductor.

The method of filling the through-hole 6 with the conductor should not be limited. However, a deposition technique by plating is preferred. Particularly, the electric plating using as a cathode the circuit pattern 1 exposed in the though-hole is preferable because it can provide the deposited metal containing less amount of impurities and hence a conductive path with low resistance.

The contact portion is a portion to be brought into electric contact with a connecting portion (e.g. electrode pad) of the device to be mounted on the mounting substrate. The contact portion is desired to provide a good contact with the connecting portion (particularly electrode pad of a bare chip) of the device to be mounted. The bump contact as shown in FIG. 1D is preferred. The bump contact may be formed in a multiple-layer structure with different materials of a surface layer and deep layer.

The conductor filled in the through-hole 6 and the conductor constituting the contact portion 7 may be copper (Cu), gold (Au), silver (Ag), nickel (Ni), tin (Sn), lead (Pb), or tin-lead alloy. Different materials may be used for the conductive path and contact portion.

FIG. 1E shows the state of step (e). This step is to remove further the insulating substrate exposed in the opening 4a using as a mask the conductive layer 2 having the opening 4a, thereby providing an opening 4b penetrating through the conductive layer 2 and insulating substrate 3. Thus, each of the circuit patterns 1 is exposed in the opening 4b.

The method of removing the insulating substrate 3 to form the openings 4b may be chemical etching, laser processing, plasma etching, etc. Further, using the photosensitive resin as the material of the insulating substrate 3, the openings 4b may be formed by the exposure/development like the method of the hole-making for the insulating layer.

Figure 2A:
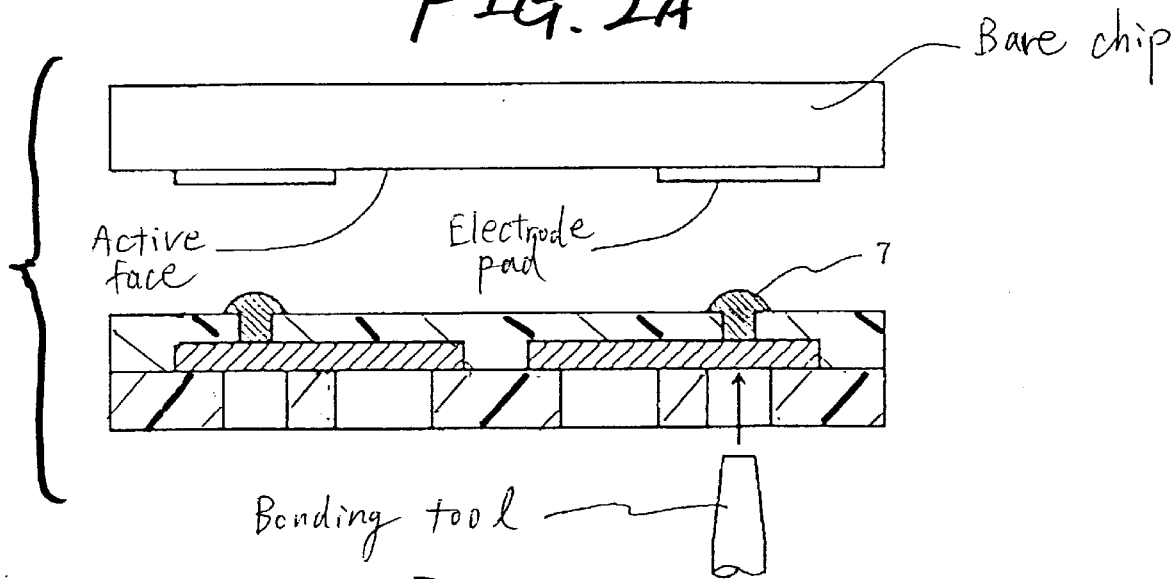
FIGS. 2A to 2C are views showing the step of mounting a bare chip on a mounting substrate according to the present invention and a view showing the resultant semiconductor device.

The opening 4b into which the circuit pattern 1 is exposed is used for electrically connecting the mounting substrate with an external device. The opening 4b is used as an inlet for injecting energy (heat, ultrasonic oscillation, etc.) for soldering the electrode pad of the bare chip to the contact portion 7, and also an operating point for pressurizing. The example of FIG. 2A shows the manner in which a bonding tool is to be inserted into the opening provided immediately before the contact point 7. Therefore, the shape of the opening 4b (i.e. shape of the opening 4a of the conductor layer 2) may be determined according to the uses of insertion of a wire for bonding, of a terminal for an external device, and of a bonding tool such as an ultrasonic oscillator (which may be also used as a jig for pressurizing).

The order of the processing steps in the manufacturing method according to the present invention, inclusive of the step of an additional processing step as described below, may be exchanged optionally. For example, the basic steps of (a) to (e) may be in the order of (a), (b), (c), (d) and (e) or of (a), (e), (b), (c) and (d). Otherwise, as shown in FIG. 1A, the layer 2 shown in FIG. 1A may be first formed, and as shown in FIG. 1E, the openings 4b may be processed. Further, after the circuit pattern has been formed, the steps (b) to (d) may be performed.

The mounting substrate (FIG. 1E) obtained by the above steps is a basic form which comprises constituents of the semiconductor element mounting substrate according to the present invention shown in the item (A) previously described.

In addition to the basic form described above, the processing for providing a more preferable form such as forming a conductive path (path on the back side) in the opening 4b or partially removing the conductive layer may be performed. Thus, several kinds of forms of mounting substrates may be provided. For example, any optional one of the openings 4b is selected within which a back side conductive path for connecting the circuit pattern with the conductive layer is formed. Thus, the conductive layer can be used as a grounding layer or shielding layer, thereby improving the electric characteristic of the semiconductor element. The conductive path on the back side may be the conductive layer formed on the wall of the opening 4b by plating the through-hole, or the conductor filled in the opening 4b.

The conductive layer, after it has been used as a mask, may be processed as a circuit ("second circuit pattern" to be distinguished from the circuit in FIG. 1A). The conductive path in the opening 4b and second circuit pattern for the conductive layer may be formed in any optional order.

The conductive layer, after it has been used as a mask, may be removed entirely.

The circuit pattern may be eroded in the process of forming the second circuit pattern for the conductive layer and entirely removing the conductive layer. For example, in the state of FIG. 1E, the portion of the circuit pattern exposed in the opening 4b is difficult to be protected and so will be eroded. Therefore, it is recommended to form the circuit pattern which is thicker than the conductive layer. Thus, without special protection of the portion exposed in the opening 4b, the conductive layer can be etched with the circuit pattern being left.

On the surface exposed in the opening 4b, the metal layer (e.g. gold, nickel/gold, solder, etc.) capable of making a good contact with a solder ball may be formed.

The usefulness of the present invention is remarkable for the bare chip irrespectively of the kind of the semiconductor element mounted on the mounting substrate according to the present invention.

Figure 2B:
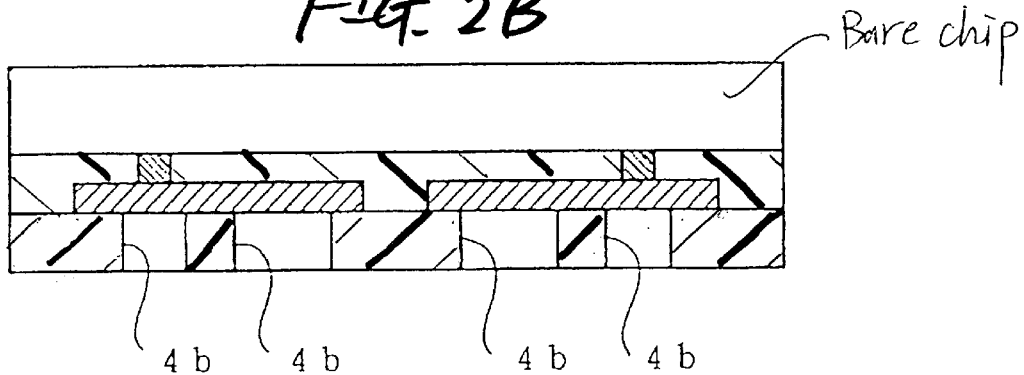

The bare chip will be mounted on the mounting substrate according to the present invention in such a manner that the contact portion 7 on the mounting substrate shown in FIG. 2A is connected to the electrode pad of the bare chip as shown in FIG. 2B. The contact portion 7 and electrode pad of the bare chip can be metallic-coupled with each other by fusion by heating, ultrasonic bonding (which is a kind of the fusion), or both techniques.

As shown in FIG. 2B, in mounting, the active face of the bare chip is thermally-pressed on the upper face of the insulating layer so that the former is brought into contact with the latter. The temperature of thermal crimping may be 100–350° C., preferably 150–250° C. In this case, the insulating layer serves as a thermally-melting type adhesive to seal the active face of the bare chip, thus completing the semiconductor device according to the present invention.

In order to prevent the semiconductor device from being damaged, the temperature of thermal crimping is preferably as low as possible within the above temperature range.

The steps of coupling the contact portion and bare chip electrode pad and of sealing the active face of the bare chip by the insulating layer may be simultaneously performed as a single step, or as individual steps (either step can be performed earlier).

Figure 2C:
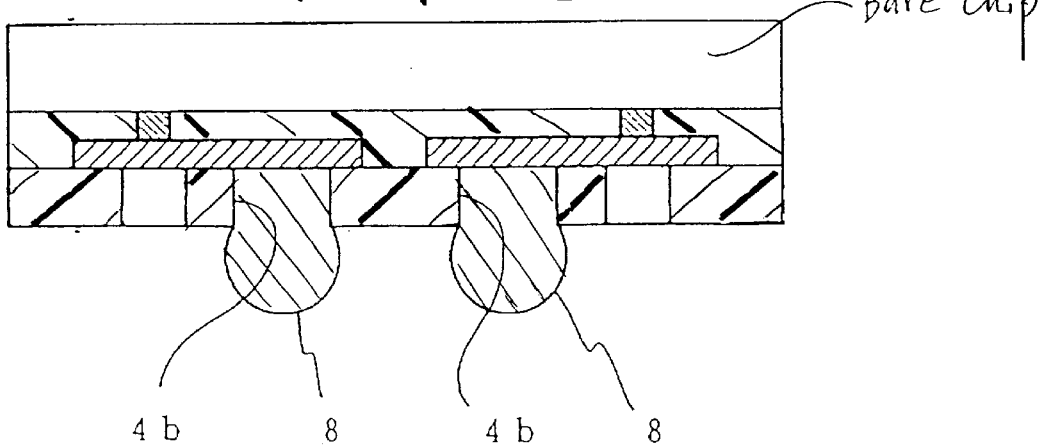

In the semiconductor device according to the present invention, the opening 4b may be filled with conductor and a protruding contact portion 8 such as a solder ball or bump contact may be further formed for connection to an external device as shown in FIG. 2C.

The outer shape of the mounting substrate according to the present invention should not be limited. Where the bare chip is to be mounted, its outer shape is a square with the sides each having a length of 50 μm–100 μm, and in most cases, the electrode pad is arranged on the periphery of the active face. Therefore, as shown in FIG. 2(a), the outer shape of the mounting substrate corresponds to or larger than that of the bare chip.

Figure 3:
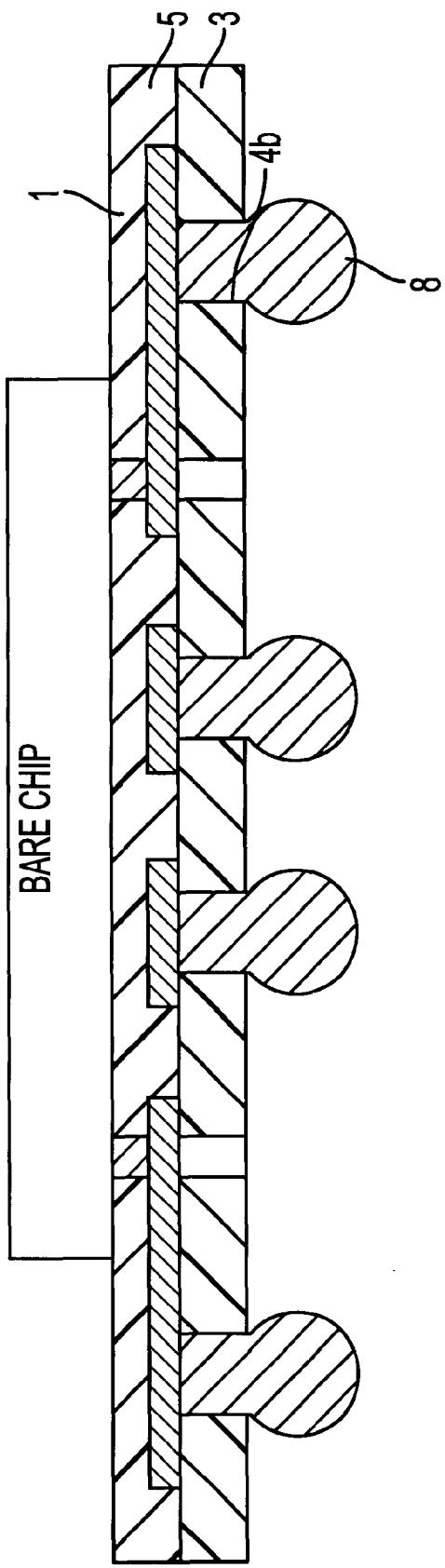
FIG. 3 is a view showing another structure of the mounting substrate according to the present invention in a state where the bare chip is mounted to complete the semiconductor device.
Figure 4:
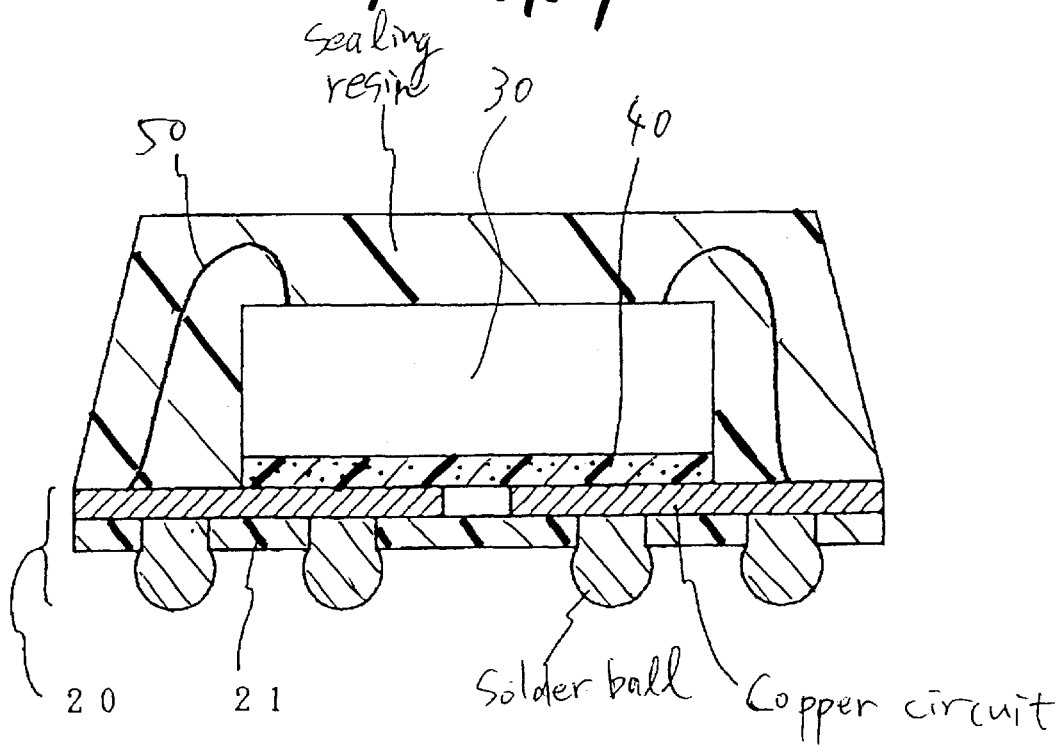
FIG. 4 is a sectional view showing one example of a conventional semiconductor device.
Figure 5:
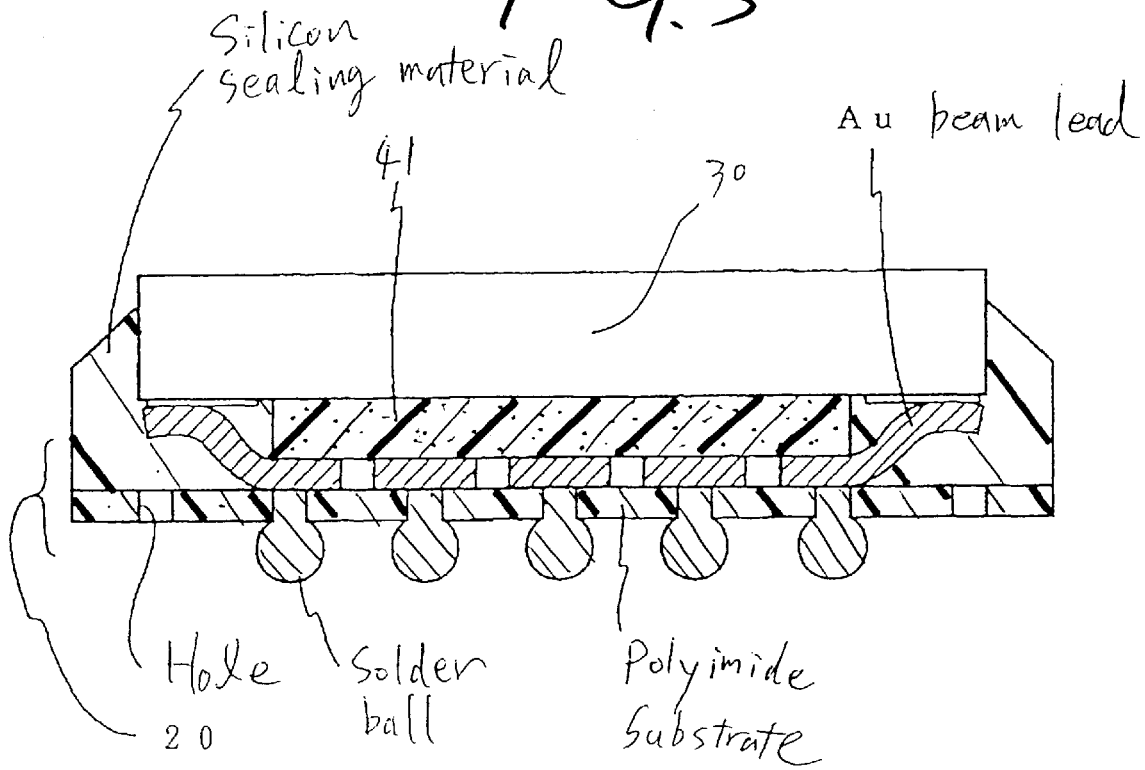
FIG. 5 is a sectional view showing another example of a conventional semiconductor device.

The construction as shown in FIG. 3 is a variation of that shown in FIG. 2C. In FIG. 3, the outer shape of the mounting substrate is formed to be larger than that of the bare chip. The circuit pattern is developed more externally than the area occupied by the bare chip. Correspondingly, the opening 4b on the back side where a protruding contact portion 8 is formed is located at a position extended outwardly as shown in FIG. 3. This permits a plurality of pins to be connected.

Embodiment 1

In this embodiment, the mounting substrate as shown in FIG. 1E is manufactured. The bare chip is mounted on the substrate. The processing and mounting property were evaluated. The steps were performed in the order of (a), (b), (c), (d) and (e).

Formation of a Mounting Substrate

A member having a three-layer structure was formed in which an insulating substrate (polyimide resin, thickness of 50 μm) is sandwiched by a first conductor layer (Cu, thickness of 12 μm) and a second conductor layer (Cu, thickness of 3 μm). By the subtractive technique, the first conductor layer is formulated into circuit patterns, and openings are formed in the second conductor layer. Thus, the substrate member having a structure as shown in FIG. 1A was obtained.

Formation of an Insulating Layer

As a Material for an insulating layer constituting an insulating layer 5 in FIG. 1B, a negative type photosensitive polyimide was used. This material is a photosensitive polyimide precursor at a stage (before light-exposure) where a layer is formed, and has the following composition.

Acid dianhydride component: 6FDA (0.5 mol), 404'-oxydiphthalate dianhydride (0.5 mol).

Diamine component: 4.4'-diamine phenylether (0.5 mol), bis aminopropyl tetramethyldisiloxane (0.5 mol) Photosensitive agent: 1-ethyl-3,5-dimethoxycarbonyl-4-(2-nitrophenyl)-1,4-dihydropiridine (0.26 mol).

The solution when the material for the insulating layer is solved in an organic solvent is applied to the circuit wiring pattern by a roll coater, and dried at 120° C. to provide an insulating layer.

Making a Hole in the Insulating Layer: Exposure/Development Processing

The insulating layer is irradiated with a radiation (i-rays) for exposure through a photomask. The insulating layer is subjected to development using an alkaline solution. Thus, as shown in FIG. 1C, a total of 3000 through-holes each having a diameter of 50μm were made so that the circuit pattern 1 is exposed to the inner bottom of the hole.

Formation of Contact Portion

By the electroplating with the circuit pattern exposed to the inner bottom of the through-hole 6 serving as a cathode, copper is deposited and filled within the through-hole to provide a conductive path 7a. Further, as shown in FIG. 1D, the copper layer is grown to protrude from the surface of the insulating layer. Further, gold is deposited to provide a surface layer. Thus, a bump contact having a two-layer structure was obtained.

Formation of Openings

With the conductive layer 2 being a mask, the insulating substrate exposed in the opening 4a of the conductive layer 2 is removed using a weak alkaline solution (TPE-300 available from TORAY ENGINEERING CO. LTD.) As shown in FIG. 1E, the opening 4b into which the circuit pattern is exposed is formed, thereby providing the mounting substrate according to the present invention.

Mounting of a Bare Chip

As shown in FIG. 2A, the active face of the bare chip and the mounting substrate are brought into contact with each other so that they are faced, and electrically connected to each other by a single point bonding technique.

Using a thermal crimping device the insulating layer is fused under the condition of pressurizing force of 20 kg/cm$^2$ and heating temperature of 300° C. and 60 sec. and the surface of the insulating layer bonded to the active face of the bare chip is sealed. Thus, the semiconductor device as shown in FIG. 2B is obtained.

Embodiment 2

In this embodiment, except that the material of the insulating layer is changed, the mounting substrate was fabricated in exactly the same manner as Embodiment 1. The bare chip was mounted on the mounting substrate.

As the material of the insulating layer, a negative-type polyimide was used. This material is a photosensitive polyimide precursor at a stage (before light-exposure) where a layer is formed, and has the following composition.

Acid dianhydride component: TMEG (0.5 mol), 3,3', 4,4'-benzophenone tetracarboxylic acid dianhydride (0.5 mol)

Diamine component: 4.4'-diamine diphenylether (0.5 mol), bis aminopropyl tetramethyldisiloxane (0.5 mol)

Photosensitive agent: 1-ethyl-3,5-dimethoxycarbonyl-4-(2-nitrophenyl)-1,4-dihydropiridine (0.26 mol).

Evaluation

In both embodiments 1 and 2, the processing performance of the through-hole in the insulating layer is easier and more simple than the abrasion processing using an excimer laser in their procedure of managing a light source and processing. Further, both embodiments provide a high mass-production performance and can be implemented at low cost.

After the bare chip has been mounted, it was uniformly sealed by the insulating layer with no bubble or crack therein. It could be effectively sealed without necessity of an adhesive layer and sealing agent.

As described above, in accordance with the present invention, a semiconductor mounting substrate can be produced at low cost and high mass-productivity. The present invention can deal with the high density wiring of an integrated circuit so that the semiconductor device having a small size and a large number of pins can be easily performed.

Although the invention has been described in its preferred form with a certain degree of particularity, it is understood that the present disclosure of the preferred form can be changed in the details of construction and in the combination and arrangement of parts without departing from the spirit and the scope of the invention as hereinafter claimed.

What is claimed is:

1. A substrate for mounting a semiconductor element comprising:

an insulating substrate;

a first circuit pattern formed on a first surface of said insulating substrate;

an insulating layer covering said first circuit pattern, said insulating layer being made of a photosensitive and thermally-melting type adhesive resin;

a contact formed on a surface of said insulating layer, said contact being connected to said first circuit pattern by a first conductive path passing through said insulating layer;

a conductive layer formed on a second surface of said insulating substrate opposite to said first surface; and an opening penetrating through said conductive layer and said insulating substrate into which said first circuit pattern is exposed.

2. A substrate for mounting a semiconductor device according to claim 1, wherein a second conductive path is formed in said opening to connect said first circuit pattern to said conductive layer.

3. A substrate for mounting a semiconductor device according to claim 1, wherein said conductive layer is formed as a second circuit pattern.

4. A semiconductor device comprising:

a semiconductor element having an electrode pad; and a substrate for mounting said semiconductor element comprising:

an insulating substrate;

a first circuit pattern formed on a first surface of said insulating substrate;

an insulating layer covering said first circuit pattern, said insulating layer being made of a photosensitive and thermally-melting type adhesive resin;

a contact formed on a surface of said insulating layer, said contact being connected to said first circuit pattern by a first conductive path passing through said insulating layer;

a conductive layer formed on a second surface of said insulating substrate opposite to said first surface; and an opening penetrating through said conductive layer and said insulating substrate into which said circuit pattern is exposed, wherein said contact of said substrate is connected to said electrode pad of said semiconductor element, and said insulating layer of said substrate is bonded onto a surface of said semiconductor element on a side of said electrode pad by heating.

5. A semiconductor device according to claim 4, wherein a second conductive path is formed in said opening to connect said first circuit pattern to said conductive layer.

6. A semiconductor device according to claim 4, wherein said conductive layer is formed as a second circuit pattern.

7. The substrate for mounting a semiconductor element of claim 1, wherein the photosensitive and thermally-melting type adhesive resin comprises one of photosensitive polyimide and photosensitive polyether sulfone.

8. The semiconductor device of claim 4, wherein the photosensitive and thermally-melting type adhesive resin comprises one of photosensitive polyimide and photosensitive polyether sulfone.

9. The substrate of claim 1, wherein the opening is formed by removing substantially the entire area of the substrate not covered by the conductive layer.

10. The semiconductor device of claim 4, wherein the opening is formed by removing substantially the entire area of the substrate not covered by the conductive layer.

\* \* \* \* \*